(12) United States Patent
Uzelac et al.

(10) Patent No.: US 9,710,105 B2
(45) Date of Patent: **\*Jul. 18, 2017**

(54) TOUCHSCREEN TESTING

(71) Applicant: MICROSOFT TECHNOLOGY LICENSING, LLC., Redmond, WA (US)

(72) Inventors: Aleksandar Uzelac, Seattle, WA (US); David A. Stevens, Sammamish, WA (US); Weidong Zhao, Redmond, WA (US); Takahiro Shigemitsu, Bellevue, WA (US); Briggs A. Willoughby, Newcastle, WA (US); John Graham Pierce, Sammamish, WA (US)

(73) Assignee: MICROSOFT TECHNOLOGY LICENSING, LLC., Redmond, WA (US)

( * ) Notice: Subject to any disclaimer, the term of this patent is extended or adjusted under 35 U.S.C. 154(b) by 60 days.

This patent is subject to a terminal disclaimer.

(21) Appl. No.: 14/620,819

(22) Filed: Feb. 12, 2015

(65) Prior Publication Data

US 2015/0160781 A1    Jun. 11, 2015

Related U.S. Application Data

(63) Continuation of application No. 13/154,161, filed on Jun. 6, 2011, now Pat. No. 8,988,087.

(Continued)

(51) Int. Cl.
*G06F 3/041* (2006.01)
*G01R 31/28* (2006.01)

(Continued)

(52) U.S. Cl.
CPC ........... *G06F 3/0418* (2013.01); *G01R 31/28* (2013.01); *G01R 31/2829* (2013.01); *G06F 3/044* (2013.01); *G09G 3/006* (2013.01)

(58) Field of Classification Search
CPC ......... G06F 3/0416; G06F 2203/04104; G06F 3/041; G06F 3/0488; G06F 3/04886;

(Continued)

(56) References Cited

U.S. PATENT DOCUMENTS

| 4,421,997 A | 12/1983 | Forys |
| 5,493,294 A | 2/1996 | Morita |

(Continued)

FOREIGN PATENT DOCUMENTS

| CN | 1242096 | 1/2000 |
| CN | 1761932 | 4/2006 |

(Continued)

OTHER PUBLICATIONS

"Actuation Force of Touch Screen", Solutions @ Mecmesin, retrieved from <http://www.ArticleOnePartners.com/index/servefile?fileId=188971>,Dec. 31, 2010, 1 page.

(Continued)

*Primary Examiner* — Alesa Allgood

(57) ABSTRACT

Touchscreen testing techniques are described. In one or more implementations, a conductor is placed proximal to a touchscreen device and the touchscreen device is tested by simulating a touch of a user by placing the conductor in a grounded state and lack of a touch by the user by placing the conductor in an ungrounded state.

20 Claims, 6 Drawing Sheets

Related U.S. Application Data

(60) Provisional application No. 61/435,672, filed on Jan. 24, 2011.

(51) Int. Cl.
*G06F 3/044* (2006.01)
*G09G 3/00* (2006.01)

(58) Field of Classification Search
CPC .... G06F 3/044; G06F 3/0418; G06F 3/03545; G06F 3/045; G06F 3/03547; G01R 27/2605; G01R 31/2829; G01R 31/28; G01R 31/028; G09G 3/006
See application file for complete search history.

(56) References Cited

U.S. PATENT DOCUMENTS

| | | | |
|---|---|---|---|
| 5,825,352 A | 10/1998 | Bisset et al. | |
| 5,825,666 A | 10/1998 | Freifeld | |
| 5,856,822 A | 1/1999 | Du et al. | |
| 5,943,043 A | 8/1999 | Furuhata et al. | |
| 6,008,636 A | 12/1999 | Miller et al. | |
| 6,021,495 A | 2/2000 | Jain et al. | |
| 6,091,406 A | 7/2000 | Kambara et al. | |
| 6,218,201 B1 | 4/2001 | Plangger et al. | |
| 6,323,846 B1 | 11/2001 | Westerman et al. | |
| 6,360,254 B1 | 3/2002 | Linden et al. | |
| 6,377,936 B1 | 4/2002 | Henrick et al. | |
| 6,671,406 B1 | 12/2003 | Anderson | |
| 6,741,237 B1 | 5/2004 | Benard et al. | |
| 6,856,259 B1 | 2/2005 | Sharp | |
| 6,959,362 B2 | 10/2005 | Wall et al. | |
| 6,977,646 B1 | 12/2005 | Hauck et al. | |
| 7,039,871 B2 | 5/2006 | Cronk | |
| 7,053,887 B2 | 5/2006 | Kraus et al. | |
| 7,174,649 B1 | 2/2007 | Harris | |
| 7,254,775 B2 | 8/2007 | Geaghan et al. | |
| 7,295,191 B2 | 11/2007 | Kraus et al. | |
| 7,362,313 B2 | 4/2008 | Geaghan et al. | |
| 7,375,454 B2 | 5/2008 | Takasaki | |
| 7,489,303 B1 | 2/2009 | Pryor | |
| 7,536,386 B2 | 5/2009 | Samji et al. | |
| 7,580,556 B2 | 8/2009 | Lee et al. | |
| 7,592,999 B2 | 9/2009 | Rosenberg et al. | |
| 7,619,618 B2 | 11/2009 | Westerman et al. | |
| 7,711,450 B2 | 5/2010 | Im et al. | |
| 7,725,014 B2 | 5/2010 | Lam et al. | |
| 7,728,821 B2 | 6/2010 | Hillis et al. | |
| 7,746,325 B2 | 6/2010 | Roberts | |
| 7,797,115 B2 | 9/2010 | Tasher et al. | |
| 7,812,828 B2 | 10/2010 | Westerman et al. | |
| 7,907,750 B2 | 3/2011 | Ariyur et al. | |
| 7,916,127 B2 * | 3/2011 | Wang | G06F 3/0416 178/18.01 |
| 7,938,009 B2 | 5/2011 | Grant et al. | |
| 7,978,182 B2 | 7/2011 | Ording et al. | |
| 8,061,223 B2 | 11/2011 | Pan | |
| 8,174,273 B2 | 5/2012 | Geaghan | |
| 8,217,909 B2 | 7/2012 | Young | |
| 8,253,425 B2 * | 8/2012 | Reynolds | G01D 3/08 324/519 |
| 8,280,119 B2 | 10/2012 | Hamza | |
| 8,311,513 B1 | 11/2012 | Nasserbakht et al. | |
| 8,314,780 B2 * | 11/2012 | Lin | G06F 3/016 178/18.06 |
| 8,330,474 B2 | 12/2012 | Vandermeijden | |
| 8,493,355 B2 | 7/2013 | Geaghan et al. | |
| 8,725,443 B2 * | 5/2014 | Uzelac | G06F 3/0418 702/79 |
| 8,773,377 B2 | 7/2014 | Zhao et al. | |
| 8,913,019 B2 | 12/2014 | Zhao et al. | |
| 8,914,254 B2 | 12/2014 | Uzelac et al. | |
| 8,982,061 B2 | 3/2015 | Zhao et al. | |
| 8,988,087 B2 * | 3/2015 | Uzelac | G01R 31/28 324/658 |
| 9,030,437 B2 * | 5/2015 | Uzelac | G06F 3/0418 345/174 |
| 9,122,341 B2 | 9/2015 | Benko et al. | |
| 2002/0147929 A1 | 10/2002 | Rose | |
| 2002/0153877 A1 | 10/2002 | Harris et al. | |
| 2003/0061520 A1 | 3/2003 | Zellers et al. | |
| 2003/0164820 A1 | 9/2003 | Kent | |
| 2003/0200465 A1 | 10/2003 | Bhat et al. | |
| 2004/0207606 A1 | 10/2004 | Atwood et al. | |
| 2005/0012724 A1 | 1/2005 | Kent | |
| 2005/0046430 A1 | 3/2005 | Kinnunen et al. | |
| 2005/0063566 A1 | 3/2005 | Beek et al. | |
| 2005/0086296 A1 | 4/2005 | Chi et al. | |
| 2005/0195978 A1 | 9/2005 | Babic et al. | |
| 2006/0097991 A1 | 5/2006 | Hotelling et al. | |
| 2006/0175485 A1 | 8/2006 | Cramer | |
| 2006/0227120 A1 | 10/2006 | Eikman | |
| 2006/0235803 A1 | 10/2006 | Romney | |
| 2006/0259957 A1 | 11/2006 | Tam et al. | |
| 2007/0081726 A1 | 4/2007 | Westerman et al. | |
| 2007/0262968 A1 * | 11/2007 | Ohshita | G06F 3/0213 345/173 |
| 2008/0041639 A1 | 2/2008 | Westerman et al. | |
| 2008/0062140 A1 | 3/2008 | Hotelling et al. | |
| 2008/0068229 A1 | 3/2008 | Chuang | |
| 2008/0109912 A1 | 5/2008 | Rivera | |
| 2008/0134343 A1 | 6/2008 | Pennington et al. | |
| 2008/0150909 A1 | 6/2008 | North et al. | |
| 2008/0158185 A1 | 7/2008 | Westerman | |
| 2008/0180399 A1 | 7/2008 | Cheng | |
| 2008/0209329 A1 | 8/2008 | DeFranco et al. | |
| 2008/0211778 A1 | 9/2008 | Ording et al. | |
| 2008/0211782 A1 * | 9/2008 | Geaghan | G06F 3/044 345/173 |
| 2008/0252616 A1 | 10/2008 | Chen | |
| 2008/0278453 A1 | 11/2008 | Reynolds et al. | |
| 2008/0284899 A1 | 11/2008 | Haubmann et al. | |
| 2008/0309624 A1 | 12/2008 | Hotelling | |
| 2008/0309629 A1 | 12/2008 | Westerman et al. | |
| 2009/0009483 A1 | 1/2009 | Hotelling et al. | |
| 2009/0046073 A1 | 2/2009 | Pennington et al. | |
| 2009/0096753 A1 | 4/2009 | Lim | |
| 2009/0141046 A1 | 6/2009 | Rathnam et al. | |
| 2009/0157206 A1 | 6/2009 | Weinberg et al. | |
| 2009/0160763 A1 | 6/2009 | Cauwels et al. | |
| 2009/0174679 A1 | 7/2009 | Westerman | |
| 2009/0190399 A1 | 7/2009 | Shibata et al. | |
| 2009/0225036 A1 * | 9/2009 | Wright | G06F 3/0416 345/173 |
| 2009/0234876 A1 | 9/2009 | Schigel et al. | |
| 2009/0241701 A1 | 10/2009 | Pan | |
| 2009/0250268 A1 | 10/2009 | Staton et al. | |
| 2009/0251435 A1 | 10/2009 | Westerman et al. | |
| 2009/0251436 A1 * | 10/2009 | Keskin | G06F 1/3203 345/174 |
| 2009/0267903 A1 | 10/2009 | Cady et al. | |
| 2009/0273584 A1 | 11/2009 | Staton et al. | |
| 2009/0289922 A1 * | 11/2009 | Henry | G06F 3/03545 345/179 |
| 2009/0300020 A1 | 12/2009 | Chen et al. | |
| 2009/0303202 A1 | 12/2009 | Liu | |
| 2009/0312009 A1 | 12/2009 | Fishel | |
| 2010/0007631 A1 * | 1/2010 | Chang | G06F 3/044 345/174 |
| 2010/0042682 A1 | 2/2010 | Kaye | |
| 2010/0053099 A1 * | 3/2010 | Vincent | G06F 3/04883 345/173 |
| 2010/0060604 A1 | 3/2010 | Zwart et al. | |
| 2010/0073318 A1 | 3/2010 | Hu et al. | |
| 2010/0088372 A1 | 4/2010 | Shridhar et al. | |
| 2010/0103118 A1 | 4/2010 | Townsend et al. | |
| 2010/0103121 A1 * | 4/2010 | Kim | G06F 3/044 345/173 |
| 2010/0117962 A1 | 5/2010 | Westernan et al. | |
| 2010/0121657 A1 | 5/2010 | Rosenberger et al. | |

(56) References Cited

U.S. PATENT DOCUMENTS

| | | |
|---|---|---|
| 2010/0134429 A1* | 6/2010 | You .................. G06F 3/044 345/173 |
| 2010/0142765 A1 | 6/2010 | Hamza |
| 2010/0192211 A1 | 7/2010 | Bono et al. |
| 2010/0193258 A1 | 8/2010 | Simmons et al. |
| 2010/0214233 A1* | 8/2010 | Lee .................. G06F 3/044 345/173 |
| 2010/0231508 A1 | 9/2010 | Cruz-Hernandez et al. |
| 2010/0241711 A1 | 9/2010 | Ansari et al. |
| 2010/0277505 A1* | 11/2010 | Ludden .............. G06F 3/0416 345/634 |
| 2010/0302211 A1 | 12/2010 | Huang |
| 2010/0309139 A1 | 12/2010 | Ng |
| 2010/0315266 A1 | 12/2010 | Gunawardana et al. |
| 2010/0315366 A1 | 12/2010 | Lee et al. |
| 2010/0315372 A1 | 12/2010 | Ng |
| 2011/0001633 A1 | 1/2011 | Lam et al. |
| 2011/0018822 A1 | 1/2011 | Lin et al. |
| 2011/0022414 A1 | 1/2011 | Ge et al. |
| 2011/0025629 A1 | 2/2011 | Grivna et al. |
| 2011/0042126 A1* | 2/2011 | Spaid .................. G06F 3/045 174/250 |
| 2011/0047590 A1 | 2/2011 | Carr et al. |
| 2011/0050620 A1* | 3/2011 | Hristov .............. G06F 3/0416 345/174 |
| 2011/0055062 A1 | 3/2011 | Juntilla et al. |
| 2011/0055912 A1 | 3/2011 | Fusari et al. |
| 2011/0080348 A1 | 4/2011 | Lin et al. |
| 2011/0084929 A1 | 4/2011 | Chang et al. |
| 2011/0106477 A1 | 5/2011 | Brunner |
| 2011/0115709 A1 | 5/2011 | Cruz-Hernandez |
| 2011/0115747 A1 | 5/2011 | Powell et al. |
| 2011/0122072 A1* | 5/2011 | Lin .................. G06F 3/016 345/173 |
| 2011/0126280 A1 | 5/2011 | Asano |
| 2011/0131633 A1 | 6/2011 | MacAskill et al. |
| 2011/0141054 A1 | 6/2011 | Wu |
| 2011/0163766 A1 | 7/2011 | Geaghan |
| 2011/0173547 A1 | 7/2011 | Lewis et al. |
| 2011/0214148 A1 | 9/2011 | Gossweiler, III et al. |
| 2011/0242001 A1 | 10/2011 | Zhang et al. |
| 2011/0248941 A1 | 10/2011 | Abdo et al. |
| 2011/0261005 A1* | 10/2011 | Joharapurkar ........ G06F 3/0418 345/174 |
| 2011/0267481 A1 | 11/2011 | Kagei |
| 2011/0289143 A1 | 11/2011 | Polis et al. |
| 2011/0298709 A1 | 12/2011 | Vaganov |
| 2011/0298745 A1 | 12/2011 | Souchkov |
| 2011/0299734 A1 | 12/2011 | Bodenmueller |
| 2011/0304577 A1 | 12/2011 | Brown |
| 2011/0304590 A1 | 12/2011 | Su et al. |
| 2011/0320380 A1 | 12/2011 | Zahn |
| 2012/0030624 A1 | 2/2012 | Migos |
| 2012/0032891 A1 | 2/2012 | Parivar |
| 2012/0044194 A1 | 2/2012 | Peng et al. |
| 2012/0065779 A1 | 3/2012 | Yamaguchi et al. |
| 2012/0065780 A1 | 3/2012 | Yamaguchi et al. |
| 2012/0068957 A1 | 3/2012 | Puskarich et al. |
| 2012/0075331 A1 | 3/2012 | Mallick |
| 2012/0105334 A1 | 5/2012 | Aumiller et al. |
| 2012/0113017 A1 | 5/2012 | Benko et al. |
| 2012/0117156 A1 | 5/2012 | Anka |
| 2012/0124615 A1 | 5/2012 | Lee |
| 2012/0131490 A1 | 5/2012 | Lin et al. |
| 2012/0146956 A1 | 6/2012 | Jenkinson |
| 2012/0153652 A1 | 6/2012 | Yamaguchi et al. |
| 2012/0185933 A1 | 7/2012 | Belk et al. |
| 2012/0187956 A1 | 7/2012 | Uzelac et al. |
| 2012/0188176 A1 | 7/2012 | Uzelac et al. |
| 2012/0188197 A1* | 7/2012 | Uzelac ............... G06F 3/044 345/174 |
| 2012/0191394 A1 | 7/2012 | Uzelac et al. |
| 2012/0206377 A1 | 8/2012 | Zhao |
| 2012/0206380 A1 | 8/2012 | Zhao |
| 2012/0223894 A1 | 9/2012 | Zhao |
| 2012/0259773 A1 | 10/2012 | Hoffman |
| 2012/0260158 A1 | 10/2012 | Steelberg |
| 2012/0265841 A1 | 10/2012 | Ross et al. |
| 2012/0268416 A1 | 10/2012 | Pirogov et al. |
| 2012/0280934 A1 | 11/2012 | Ha et al. |
| 2012/0280946 A1 | 11/2012 | Shih et al. |
| 2012/0301009 A1 | 11/2012 | Dabic |
| 2012/0317208 A1 | 12/2012 | Sousa et al. |
| 2012/0319992 A1 | 12/2012 | Lee |
| 2012/0331108 A1 | 12/2012 | Ferdowsi et al. |
| 2013/0016045 A1 | 1/2013 | Zhao |
| 2013/0063167 A1 | 3/2013 | Jonsson |
| 2013/0066975 A1 | 3/2013 | Kantor et al. |
| 2013/0067303 A1 | 3/2013 | Kantor et al. |
| 2013/0067594 A1 | 3/2013 | Kantor et al. |
| 2013/0113751 A1 | 5/2013 | Uzelac |
| 2013/0197862 A1 | 8/2013 | Uzelac et al. |
| 2013/0238129 A1 | 9/2013 | Rose et al. |
| 2013/0278539 A1 | 10/2013 | Valentine et al. |
| 2013/0345864 A1 | 12/2013 | Park |
| 2014/0081793 A1 | 3/2014 | Hoffberg |
| 2014/0111484 A1 | 4/2014 | Welch et al. |
| 2014/0111485 A1 | 4/2014 | Welch et al. |
| 2014/0354310 A1 | 12/2014 | Hargrove et al. |
| 2015/0160781 A1* | 6/2015 | Uzelac .............. G01R 31/28 345/174 |
| 2015/0193083 A1 | 7/2015 | Uzelac et al. |

FOREIGN PATENT DOCUMENTS

| | | |
|---|---|---|
| CN | 1942853 | 4/2007 |
| CN | 200947594 | 9/2007 |
| CN | 101553777 | 10/2009 |
| CN | 101819496 A | 1/2010 |
| CN | 101661373 | 3/2010 |
| CN | 101937296 | 1/2011 |
| CN | 201828476 | 5/2011 |
| CN | 2201903594 | 7/2011 |
| CN | 202093112 | 12/2011 |
| CN | 101545938 | 1/2012 |
| CN | 202171626 | 3/2012 |
| CN | 202196126 | 4/2012 |
| CN | 102436334 | 5/2012 |
| CN | 101982783 | 7/2012 |
| DE | 19939159 | 3/2000 |
| EP | 2077490 | 7/2009 |
| EP | 2284654 | 2/2011 |
| JP | 2003303051 | 10/2003 |
| JP | 2007323731 | 12/2007 |
| KR | 20010019445 | 3/2001 |
| KR | 20050003155 | 1/2005 |
| KR | 20050094359 | 9/2005 |
| KR | 20070007963 | 1/2007 |
| KR | 100763057 | 10/2007 |
| KR | 20080019949 | 3/2008 |
| KR | 20080066416 | 7/2008 |
| KR | 100941441 | 2/2010 |
| KR | 20100067178 | 6/2010 |
| KR | 20100077298 | 7/2010 |
| KR | 20100129015 | 12/2010 |
| KR | 20100135982 | 12/2010 |
| KR | 101007049 | 1/2011 |
| KR | 20110005946 | 1/2011 |
| KR | 20110011337 | 2/2011 |
| KR | 20110016349 | 2/2011 |
| KR | 101065014 | 9/2011 |
| TW | 200925966 | 6/2009 |
| TW | M361674 | 7/2009 |
| TW | M379794 | 5/2010 |
| TW | 201104513 | 2/2011 |
| WO | WO-9938149 | 7/1999 |
| WO | WO-2005114369 | 12/2005 |
| WO | WO-2006042309 | 4/2006 |
| WO | WO-2010073329 | 7/2010 |

(56) References Cited

FOREIGN PATENT DOCUMENTS

| WO | WO-2012150274 | 11/2012 |
|----|---------------|---------|
| WO | WO-2013063042 | 5/2013  |

OTHER PUBLICATIONS

"Advisory Action", U.S. Appl. No. 13/293,060, Mar. 26, 2015, 2 pages.

"AO Touch Screen Tester", retrieved from <http://www.ao-cs.com/Projects/touch%20screen%20tester%20project.html>, Dec. 31, 2010, 1 page.

"Capacitive Touch Sensors—Application Fields, Technology Overview and Implementation Example", Fujitsu Microelectronics Europe GmbH; retrieved from http://www.fujitsu.com/downloads/MICRO/fme/articles/fujitsu-whitepaper-capacitive-touch-sensors.pdf on Jul. 20, 2011, Jan. 12, 2010, 12 pages.

"Corrected Notice of Allowance", U.S. Appl. No. 13/154,161, Feb. 24, 2015, 2 pages.

"Corrected Notice of Allowance", U.S. Appl. No. 13/156,243, Jun. 6, 2014, 4 pages.

"Corrected Notice of Allowance", U.S. Appl. No. 13/205,319, Feb. 26, 2015, 2 pages.

"Corrected Notice of Allowance", U.S. Appl. No. 13/362,238, Nov. 18, 2014, 2 pages.

"Extended European Search Report", EP Application No. 11840170.2, Jul. 16, 2014, 10 pages.

"Final Office Action", U.S. Appl. No. 12/941,693, Nov. 18, 2013, 21 Pages.

"Final Office Action", U.S. Appl. No. 12/941,693, Nov. 26, 2012, 22 Pages.

"Final Office Action", U.S. Appl. No. 13/152,991, Aug. 20, 2014, 14 pages.

"Final Office Action", U.S. Appl. No. 13/152,991, Sep. 20, 2013, 14 pages.

"Final Office Action", U.S. Appl. No. 13/154,161, Apr. 22, 2014, 16 pages.

"Final Office Action", U.S. Appl. No. 13/183,377, Oct. 15, 2013, 12 pages.

"Final Office Action", U.S. Appl. No. 13/198,036, Aug. 14, 2014, 17 pages.

"Final Office Action", U.S. Appl. No. 13/229,121, Nov. 21, 2013, 15 pages.

"Final Office Action", U.S. Appl. No. 13/229,214, Jul. 26, 2013, 25 pages.

"Final Office Action", U.S. Appl. No. 13/293,060, Sep. 25, 2013, 10 pages.

"Final Office Action", U.S. Appl. No. 13/293,060, Nov. 6, 2014, 14 pages.

"Final Office Action", U.S. Appl. No. 13/530,692, Apr. 10, 2014, 16 pages.

"Foreign Notice of Allowance", CN Application No. 201110349777.5, May 28, 2014, 6 pages.

"Foreign Notice of Allowance", TW Application No. 101100606, Sep. 29, 2014, 4 pages.

"Foreign Office Action", CN Application No. 201210018527.8, Feb. 24, 2014, 10 Pages.

"Foreign Office Action", CN Application No. 201210018527.8, Oct. 29, 2014, 12 pages.

"Foreign Office Action", CN Application No. 201210029859.6, Feb. 21, 2014, 15 Pages.

"Foreign Office Action", CN Application No. 201210029859.6, Oct. 17, 2014, 8 Pages.

"Foreign Office Action", CN Application No. 201210031164.1, Feb. 16, 2015, 7 Pages.

"Foreign Office Action", CN Application No. 201210031164.1, Mar. 5, 2014, 14 Pages.

"Foreign Office Action", CN Application No. 201210031164.1, Sep. 11, 2014, 9 Pages.

"Foreign Office Action", CN Application No. 201210446236.9, Dec. 3, 2014, 11 pages.

"Foreign Office Action", TW Application No. 101100606, Apr. 15, 2014, 10 pages.

"Haptic-Actuator Controllers", retrieved from <http://www.maxim-ic.com/products/data_converters/touch-interface/haptic-actuator.cfm> on May 4, 2011, 2011, 1 page.

"How to Use the Precision Touch Testing Tool", retrieved from <http://feishare.com/attachments/article/279/precision-touch-testing-tool-Windows8-hardware-certification.pdf>, Apr. 15, 2012, 10 pages.

"Input Testing Tool", U.S. Appl. No. 13/659,777, Oct. 24, 2012, 45 pages.

"International Search Report and Written Opinion", Application No. PCT/US2013/053621, Feb. 20, 2013, 10 pages.

"International Search Report and Written Opinion", Application No. PCT/US2012/053681, Feb. 27, 2013, 11 pages.

"International Search Report and Written Opinion", Application No. PCT/US2013/061067, Feb. 7, 2014, 11 pages.

"International Search Report and Written Opinion", Application No. PCT/US2013/046208, Sep. 27, 2013, 12 pages.

"International Search Report and Written Opinion", Application No. PCT/US2011/055621, Jun. 13, 2012, 8 pages.

"International Search Report and Written Opinion", Application No. PCT/US2013/021787, May 13, 2013, 9 pages.

"International Search Report and Written Opinion", Application No. PCT/US2012/024780, Sep. 3, 2012, 9 pages.

"International Search Report and Written Opinion", Application No. PCT/US2012/024781, Sep. 3, 2012, 9 pages.

"International Search Report and Written Opinion", Application No. PCT/US2012/027642, Sep. 3, 2012, 9 pages.

"International Search Report", Application No. PCT/US2011/058855, Nov. 1, 2011, 8 pages.

"Linearity Testing Solutions in Touch Panels", retrieved from <advantech.com/machine-automation/ . . ./%7BDO5BC586-74DD-4BFA-B81A-2A9F7ED489F/>, Nov. 15, 2011, 2 pages.

"MAX11871", retrieved from <http://www.maxim-ic.com/datasheet/index.mvp/id/7203> on May 4, 2011, Mar. 25, 2011, 2 pages.

"MicroNav Integration Guide Version 3.0", retrieved from <http://www.steadlands.com/data/interlink/micronavintguide.pdf>, Dec. 31, 2003, 11 pages.

"Microsoft Windows Simulator Touch Emulation", retrieved from <blogs.msdn.com/b/visualstudio/archive/2011/09/30/microsoft-windows-simulator-touch-emulation.aspx>, Sep. 30, 2011, 3 pages.

"MOSS User Permissions and 'Modify Shared Webpart' Link", retreived from http://www.sharepointdev.net/sharepoint—general-question-answers-discussion/moss-user-permissions-modify-shared-webpart-link-13744.shtml on Aug. 8, 2011, 2009, 3 pages.

"Non-Final Office Action", U.S. Appl. No. 12/941,693, May 16, 2013, 13 pages.

"Non-Final Office Action", U.S. Appl. No. 12/941,693, Jul. 18, 2012, 19 pages.

"Non-Final Office Action", U.S. Appl. No. 13/099,288, Feb. 6, 2014, 13 pages.

"Non-Final Office Action", U.S. Appl. No. 13/099,288, Jun. 10, 2014, 22 pages.

"Non-Final Office Action", U.S. Appl. No. 13/152,991, Mar. 21, 2014, 18 pages.

"Non-Final Office Action", U.S. Appl. No. 13/152,991, Dec. 31, 2014, 18 pages.

"Non-Final Office Action", U.S. Appl. No. 13/152,991, Mar. 21, 2013, 10 pages.

"Non-Final Office Action", U.S. Appl. No. 13/154,161, Jan. 3, 2014, 14 pages.

"Non-Final Office Action", U.S. Appl. No. 13/156,243, Sep. 19, 2013, 12 pages.

"Non-Final Office Action", U.S. Appl. No. 13/183,377, Feb. 27, 2014, 12 pages.

"Non-Final Office Action", U.S. Appl. No. 13/183,377, Jun. 21, 2013, 10 pages.

"Non-Final Office Action", U.S. Appl. No. 13/198,036, Jan. 31, 2014, 14 pages.

(56) References Cited

OTHER PUBLICATIONS

"Non-Final Office Action", U.S. Appl. No. 13/205,319, Sep. 9, 2014, 13 pages.
"Non-Final Office Action", U.S. Appl. No. 13/228,283, Aug. 27, 2013, 12 pages.
"Non-Final Office Action", U.S. Appl. No. 13/229,121, Jun. 7, 2013, 13 pages.
"Non-Final Office Action", U.S. Appl. No. 13/229,214, Feb. 15, 2013, 23 pages.
"Non-Final Office Action", U.S. Appl. No. 13/229,214, Mar. 26, 2014, 25 pages.
"Non-Final Office Action", U.S. Appl. No. 13/293,060, Jul. 23, 2014, 12 pages.
"Non-Final Office Action", U.S. Appl. No. 13/293,060, Nov. 29, 2013, 11 pages.
"Non-Final Office Action", U.S. Appl. No. 13/293,060, Jul. 12, 2013, 9 pages.
"Non-Final Office Action", U.S. Appl. No. 13/530,692, Jan. 31, 2014, 14 pages.
"Non-Final Office Action", U.S. Appl. No. 13/530,692, Aug. 25, 2014, 18 pages.
"Non-Final Office Action", U.S. Appl. No. 13/659,777, Nov. 4, 2014, 10 pages.
"Non-Final Office Action", U.S. Appl. No. 13/664,840, Jul. 15, 2014, 14 pages.
"Non-Final Office Action", U.S. Appl. No. 13/905,093, Feb. 20, 2015, 18 pages.
"Notice of Allowance", U.S. Appl. No. 12/941,693, Jan. 12, 2015, 8 Pages.
"Notice of Allowance", U.S. Appl. No. 12/941,693, Aug. 13, 2014, 8 pages.
"Notice of Allowance", U.S. Appl. No. 13/099,288, Oct. 28, 2014, 9 pages.
"Notice of Allowance", U.S. Appl. No. 13/154,161, Nov. 7, 2014, 10 pages.
"Notice of Allowance", U.S. Appl. No. 13/156,243, Jan. 28, 2014, 8 pages.
"Notice of Allowance", U.S. Appl. No. 13/183,377, Jul. 18, 2014, 7 pages.
"Notice of Allowance", U.S. Appl. No. 13/198,415, Dec. 26, 2013, 8 pages.
"Notice of Allowance", U.S. Appl. No. 13/205,319, Dec. 19, 2014, 8 pages.
"Notice of Allowance", U.S. Appl. No. 13/362,238, Jul. 28, 2014, 11 pages.
"Notice of Allowance", U.S. Appl. No. 13/530,692, Mar. 3, 2015, 8 pages.
"Office Web Apps: Share a SkyDriver Folder", retrieved from http://explore.live.com/office-web-apps-skydrive-share-using on Aug. 8, 2011, 2011, 2 pages.
"Office Web Apps: Share files on SkyDrive", retrieved from http://explore.live.com/office-web-apps-skydrive-share-files-using on Aug. 8, 2011, 1 page.
"OptoFidelity Touch & Test", retrieved from <http://www.ArticleOnePartners.com/index/servefile?fileId=188969, Feb. 20, 2012, 2 pages.
"OptoFidelity Touch and Test", retrieved from <http://www.ArticleOnePartners.com/index/servefile?fileId=188420>, May 4, 2012, 2 pages.
"OptoFidelity Two Fingers -robot", video available at <http://www.youtube.com/watch?v=YppRASbXHfk&feature=player_embedded#!section> , Sep. 15, 2010, 2 pages.
"Projected Capacitive Test Fixture", retrieved from <http://www.touch-intl.com/downloads/DataSheets%20for%20Web/6500443-PCT-DataSheet-Web.pdf>, 2009, 2 pages.
"Public or Private Articles", retrieved from <http://www.presspublisher.com/features/public-or-private-articles> on Aug. 8, 2011, 2011, 3 pages.
"Resistive Touch Screen_Resistance Linearity Test", video available at <http://www.youtube.com/watch?v=hb23GpQdXXU>, Jun. 17, 2008, 2 pages.
"Restriction Requirement", U.S. Appl. No. 13/205,319, May 8, 2014, 6 pages.
"Search Report", TW Application No. 101100609, Oct. 16, 2014, 1 page.
"Setting Sharing Permissions for Google Docs and Google Sites", retrieved from http://www.library.kent.edu/files/SMS_Google_Sharing_Permissions.pdf on Aug. 8, 2011, 8 pages.
"Share Office documents in SkyDrive", retrieved from http://office.microsoft.com/en-us/web-apps-help/share-office-documents-in-skydrive-HA101820121.aspx on Aug. 8, 2011, 3 pages.
"Shared Folder Permissions", retrieved from http://www.tech-faq.com/shared-folder-permissions.html on Aug. 8, 2011, 7 pages.
"Smartphone Automatic Testing Robot at UEI Booth", video available at <http://www.youtube.com/watch?v=f-Q4ns-b9sA>, May 9, 2012, 2 pages.
"STM23S-2AN NEMA 23 Integrated Drive+Motor", Retrieved from: <http://www.applied-motion.com/products/integrated-steppers/stm23s-2an> on Jan. 24, 2012, Jan. 24, 2010, 3 pages.
"Supplemental Notice of Allowance", U.S. Appl. No. 13/362,238, Sep. 18, 2014, 4 pages.
"Technology Comparison: Surface Acoustic Wave, Optical and Bending Wave Technology", 3M Touch Systems, Available at >http://multimedia.3m.com/mws/mediawebserver?mwsId=66666UuZjcFSLXTtnXT2NXTaEVuQEcuZgVs6EVs6E666666—&fn=DST-Optical-SAW%20Tech%20Brief.pdf>,2009, pp. 1-4.
"Touch Panel Inspection & Testing Solution", retrieved from <http://www.ArticleOnePartners.com/index/servefile?fileId=188967>, Dec. 31, 2010, 1 page.
"Touch Panel Semi-Auto Handler Model 3810", retrieved from <http://www.chromaus.com/datasheet/3810_en.pdf>, Dec. 31, 2010, 2 pages.
"Touch Quality Test Robot", U.S. Appl. No. 13/530,692, Jun. 22, 2012, 40 pages.
"TouchSense Systems Immersion", retrieved from <http://www.ArticleOnePartners.com/index/servefile?fileId=188486>, Jun. 19, 2010, 20 pages.
"Using Low Power Mode on the MPR083 and MPR084", Freescale Semiconductor Application Note, Available at <http://cache.freescale.com/files/sensors/doc/app_note/AN3583.pdf>,Nov. 2007, pp. 1-5.
ASIF, et al.,' "MPEG-7 Motion Descriptor Extraction for Panning Camera Using Sprite Generated", In Proceedings of AVSS 2008, Available at <http://ieeexplore.ieee.org/stamp/stamp.jsp?tp=&arnumber=4730384>,Sep. 2008, pp. 60-66.
Baraldi, et al.,' "WikiTable: Finger Driven Interaction for Collaborative Knowledge-Building Workspaces", Proceedings of the 2006 Conference on Computer Vision and Pattern Recognition Workshop (CVPRW '06), available at <<http://ieeexplore.ieee.org/stamp/stamp.jsp?tp=&arnumber=1640590>>,Jul. 5, 2006, 6 pages.
Benko, et al.,' "Resolving Merged Touch Contacts", U.S. Appl. No. 12/914,693, Nov. 8, 2010, 22 pages.
Binns, "Multi-"Touch" Interaction via Visual Tracking", Bachelor of Science in Computer Science with Honours, The University of Bath, available at <<http://www.cs.bath.ac.uk/~mdv/courses/CM30082/projects.bho/2008-9/Binns-FS-dissertation-2008-9.pdf>>,May 2009, 81 pages.
Brodkin, "Windows 8 hardware: Touchscreens, sensor support and robotic fingers", <<http://arstechnica.com/business/news/2011/09/windows-8-hardware-touch-screens-sensor-support-and-robotic-fingers.ars>>, Sep. 13, 2011, 1 Page.
"Robot Touchscreen Analysis", <<http://ybuffet.posterous.com/labsmotocom-blog-archive-robot-touchscreen-an>>, Apr. 19, 2010, 2 Pages.
Cao, et al.,' "Evaluation of an On-line Adaptive Gesture Interface with Command Prediction", In Proceedings of GI 2005, Available at <http://citeseerx.ist.psu.edu/viewdoc/download;jsessionid=DAB1B08F620C23464427932BAF1ECF49?doi=10.1.1.61.6749&rep=rep1&type=pdf>,May 2005, 8 pages.

(56) References Cited

OTHER PUBLICATIONS

Cao, et al.,' "ShapeTouch: Leveraging Contact Shape on Interactive Surfaces", In Proceedings of Tabletop 2008, Available at <http://www.cs.toronto.edu/~caox/tabletop2008_shapetouch.pdf>,2008, pp. 139-146.

Cravotta, "The Battle for Multi-touch", Embedded Insights, retrieved from <http://www.embeddedinsights.com/channels/2011/04/12/the-battle-for-multi-touch/> on May 4, 2011,Apr. 12, 2011, 3 pages.

Dang, et al.,' "Hand Distinction for Multi-Touch Tabletop Interaction", University of Augsburg; Institute of Computer Science; Proceedings of the ACM International Conference on Interactive Tabletops and Surfaces, Nov. 23-25, 2009, 8 pags.

Dillencourt, et al.,' "A General Approach to Connected-Component Labeling for Arbitrary Image Representations", Journal of the Association for Computing Machinery, vol. 39, No. 2, available at <<http://www.cs.umd.edu/~hjs/pubs/DillJACM92.pdf>>,Apr. 1992, pp. 253-280.

Dillow, "Liquid-Filled Robot Finger More Sensitive to Touch Than a Human's", retrieved from <www.popsci.com/technology/article/2012-06/new-robot-finger-more-sensitive-touch-human> on Jul. 27, 2012, Jun. 19, 2012, 3 pages.

Hoggan, et al.,' "Mobile Multi-Actuator Tactile Displays", In 2nd international conference on Haptic and audio interaction design, retrieved from <http://www.dcs.gla.ac.uk/~stephen/papers/HAID2.pdf >,Oct. 29, 2007, 12 pages.

Hoshino, et al.,' "Pinching at finger tips for humanoid robot hand", Retrieved at <<http://web.mit.edu/zoz/Public/HoshinoKawabuchiRobotHand.pdf>>, Jun. 30, 2005, 9 Pages.

Kastelan, et al.,' "Stimulation Board for Automated Verification of Touchscreen-Based Devices", 22nd International Conference on Field Programmable Logic and Applications, Available at <https://www2.lirmm.fr/lirmm/interne/BIBLI/CDROM/MIC/2012/FPL_2012/Papers/PHD7.pdf>,Aug. 29, 2012, 2 pages.

Kastelan, et al.,' "Touch-Screen Stimulation for Automated Verification of Touchscreen-Based Devices", in IEEE 19th International Conference and Workshops on Engineering of Computer Based Systems, Apr. 11, 2012, pp. 52-55.

Khandkar, et al.,' "Tool Support for Testing Complex MultiTouch Gestures", ITS 2010, Nov. 7-10, 2010, Saarbrucken, Germany, Nov. 7, 2010, 10 pages.

Kjellgren, "Developing a remote control application for Windows CE", Bachelor Thesis performed in Computer Engineering at ABE Robotics, Miilardalen University, Department of Computer Science and Electronics, Retrieved at <<http://www.idt.mdh.se/utbildning/exjobblfiles/TR0661.pdf>>,May 30, 2007, 43 Pages.

Kuosmanen, "OptoFidelity Automating UI Testing", video available at <http://www.youtube.com/watch?v=mOZ2r7ZvyTg&feature=player_embedded#!section> , Oct. 14, 2010, 2 pages.

Kuosmanen, "Testing the Performance of Touch-Enabled Smartphone User Interfaces", retrieved from <http://www.ArticleOnePartners.com/index/servefile?fileld=188442>, Dec. 31, 2008, 2 pages.

Levin, et al.,' "Tactile-Feedback Solutions for an Enhanced User Experience", retrieved from >http://www.pbinterfaces.com/documents/Tactile_Feedback_Solutions.pdf>, Oct. 31, 2009, pp. 18-21.

Li, et al.,' "Role Based Access Control for Social Network Sites", Department of Computer Science, Sun Yat-sen University; retrieved from http://ieeexplore.ieee.org/stamp/stamp.jsp?arnumber=05420153, Dec. 3-5, 2009, 6 pages.

McGlaun, "Microsoft's Surface 2.0 Stress Testing Robot Called Patty Shown off for First Time", Retrieved at <<http://www.slashgear.com/microsofts-surface-2-0-stress-testing-robot-called-patty-shown-off-for-first-time-19172971/>>, Aug. 19, 2011, 1 Page.

McMahan, et al.,' "Haptic Displayof Realistic Tool Contact via Dynamically Compensated Control of a Dedicated Actuator", International Conference on Intelligent Robots and Systems, St. Louis, MO, Oct. 11-15, 2009, retrieved from <http://repository.upenn.edu/meam_papers/222>,Dec. 15, 2009, 9 pages.

Pratt, "Factors Affecting Sensor Response", Analog Devices, AN-830 Application Note, Available at <http://www.analog.com/static/imported-files/application_notes/5295737729138218742AN830_0.pdf>,Dec. 2005, pp. 1-8.

Takeuchi, et al.,' "Development of a Muti-fingered Robot Hand with Softness changeable Skin Mechanism", International Symposium on and 2010 6th German Conference on Robotics (ROBOTIK), Retrieved at <<http://ieeexplore.ieee.org/stamp/stamp.jsp?arnumber=05756853>>,Jun. 7, 2010, 7 Pages.

Tao, et al.,' "An Efficient Cost Model for Optimization of Nearest Neighbor Search in Low and Medium Dimensional Spaces", Knowledge and Data Engineering, vol. 16 Issue: 10, retrieved from <<http://www.cals.ntu.edu.sg/~jzhang/papers/ecmonns.pdf>> on Mar. 16, 2011, Oct. 2004, 16 pages.

Terpstra, "BetterTouchTool Makes Multi-touch Infinitely More Useful, for Free", retrieved from <http://www.tuaw.com/2010/01/05/bettertouchtool-makes-multi-touch-infinitely-more-useful-for-fr/> on Jul. 20, 2012, Jan. 5, 2010, 4 pages.

Toto, "Video: Smartphone Test Robot Simulates Countless Flicking and Tapping", retrieved from <techcrunch.com/2010/12/21/video-smartphone-test-robot-simulates-countless-flicking-and-tapping/>, Dec. 21, 2010, 2 pages.

Tsuchiya, et al.,' "Vib-Touch: Virtual Active Touch Interface for Handheld Devices", In Proceedings of the 18th IEEE International Symposium on Robot and Human Interactive Communication, Available at <http://www.mech.nagoya-u.ac.jp/asi/en/member/shogo_okamoto/papers/tsuchiyaROMAN2009.pdf>,Oct. 2009, pp. 12-17.

Westman, et al.,' "Color Segmentation by Hierarchical Connected Components Analysis with Image Enhancement by Symmetric Neighborhood Filter", Pattern Recognition, 1990. Proceedings., 10th International Conference on Jun. 16-21, 1990, retrieved from <<http://ieeexplore.ieee.org/stamp/stamp.jsp?tp=&arnumber=118219>> on Mar. 16, 2011, Jun. 16, 1990, pp. 796-802.

Wilson, "TouchLight: An Imaging Touch Screen and Display for Gesture-Based Interaction", in Proceedings of ICIM 2004, Available at <http://citeseerx.ist.psu.edu/viewdoc/download?doi=10.1.1.95.3647&rep=rep1&type=pdf >,Oct. 2004, 8 pages.

Wimmer, et al.,' "Modular and Deformable Touch-Sensitive Surfaces Based on Time Domain Reflectometry", In Proceedings of UIST 2011, Available at <http://www.medien.ifi.lmu.de/pubdb/publications/pub/wimmer2011tdrTouch/wimmer2011tdrTouch.pdf>,Oct. 2011, 10 pages.

Zivkov, et al.,' "Touch Screen Mobile Application as Part of Testing and Verification System", Proceedings of the 35th International Convention, May 21, 2012, pp. 892-895.

"Fifth Office Action Issued in Chinese Patent Application No. 201210018527.8", Mailed Date: Jun. 28, 2016, 15 Pages.

"Final Office Action", U.S. Appl. No. 13/905,093, Aug. 19, 2015, 17 pages.

"Foreign Notice of Allowance", CN Application No. 201210031164.1, Jul. 6, 2015, 3 Pages.

"Foreign Office Action", CN Application No. 201210018527.8, Jul. 10, 2015, 13 Pages.

"Non-Final Office Action", U.S. Appl. No. 13/293,060, Jun. 2, 2015, 14 pages.

"Corrected Notice of Allowance", U.S. Appl. No. 13/205,319, Apr. 2, 2015, 2 pages.

"Corrected Notice of Allowance", U.S. Appl. No. 13/530,692, Apr. 23, 2015, 4 pages.

"Final Office Action", U.S. Appl. No. 13/152,991, May 6, 2015, 20 pages.

"Foreign Notice of Allowance", TW Application No. 101100609, Feb. 26, 2015, 4 pages.

"Foreign Office Action", CN Application No. 201210029859.6, Apr. 7, 2015, 8 Pages.

"Non-Final Office Action", U.S. Appl. No. 13/198,036, Apr. 16, 2015, 13 pages.

"Notice of Allowance", U.S. Appl. No. 12/941,693, May 6, 2015, 8 pages.

(56) References Cited

OTHER PUBLICATIONS

"Fourth Office Action Issued in Chinese Patent Application No. 201210018527.8", Mailed Date: Jan. 18, 2016, 15 Pages.

* cited by examiner

300

TOUCHSCREEN TESTING

RELATED APPLICATIONS

This application claims priority under 35 U.S.C. Section 120 to U.S. patent application Ser. No. 13/154,161, filed Jun. 6, 2011, and titled "Touchscreen Testing," which claims priority under 35 U.S.C. Section 119(e) to U.S. Provisional Patent Application No. 61/435,672, filed Jan. 24, 2011 and titled "Touchscreen Testing," the entire disclosure of which are hereby incorporated by reference.

BACKGROUND

Display and input techniques utilized by computing devices are ever evolving. For example, initial computing devices were provided with monitors. A user interacted with the computing device by viewing simple text on the monochrome monitor and entering text via a keyboard that could then be viewed on the monitor. Other techniques were then subsequently developed, such as graphical user interfaces and cursor control devices.

Display and input techniques have continued to evolve, such as to sense touch using a touchscreen display of a computing device to recognize gestures. A user, for instance, may interact with a graphical user interface by inputting a gesture using the user's hand that is detected by the touchscreen display. However, traditional techniques that were utilized to test touchscreen displays were often inaccurate and therefore were typically inadequate to test the touchscreen displays as suitable for intended use of the device.

SUMMARY

Touchscreen testing techniques are described. In one or more implementations, a piece of conductor (e.g., metal) is positioned as proximal to a touchscreen device and the touchscreen device is tested by simulating a touch of a user by placing the conductor in a grounded state and lack of a touch by the user by placing the conductor in an ungrounded state.

In one or more implementations, an apparatus includes a conductor configured to contact a touchscreen device, an electrical switch that is electrically coupled to the conductor, and one or more modules communicatively coupled to the electrical switch. The one or more modules are configured to test the touchscreen device by causing the electrical switch to place the conductor in a grounded state when contacting the touchscreen device to emulate a touch by a user and cause the electrical switch to place the conductor in an ungrounded state when contacting the touchscreen device to emulate lack of a touch by the user.

In one or more implementations, grounding of a conductor to be applied against a touchscreen device is adjusted and the touchscreen device is tested by simulating a touch of a user by grounding the conductor using an electrical switch.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Conventional techniques that were utilized to test touchscreen devices were often difficult to reproduce. Consequently, test results from these conventional techniques could be inaccurate and difficult to interpret and thus often failed for their intended purpose.

Touchscreen testing techniques are described herein. In one or more implementations, techniques are described in which a touch input of a part of a user's body is simulated by using a conductor (e.g., an electrical conductor such as a piece of metal) that is grounded. For example, the conductor may be shaped to approximate a shape and/or area of a portion of a user's finger that is typically used to contact a touchscreen device and grounded to mimic contact of a user's finger with the device. The metal may then alternate between grounded and ungrounded (i.e., floating) states to mimic contact and non-contact by a user's finger, respectively. Thus, the touchscreen device may be tested using the metal contact without having to move the metal contact (e.g., using a mechanical switch). Further discussion of these techniques may be found in the following discussion in corresponding sections.

In the following discussion, an example environment is first described that may employ the testing techniques described herein. Example procedures are then described which may be performed in the example environment as well as other environments. Consequently, performance of the example procedures is not limited to the example environment and the example environment is not limited to performance of the example procedures.

Example Environment

Figure 1:
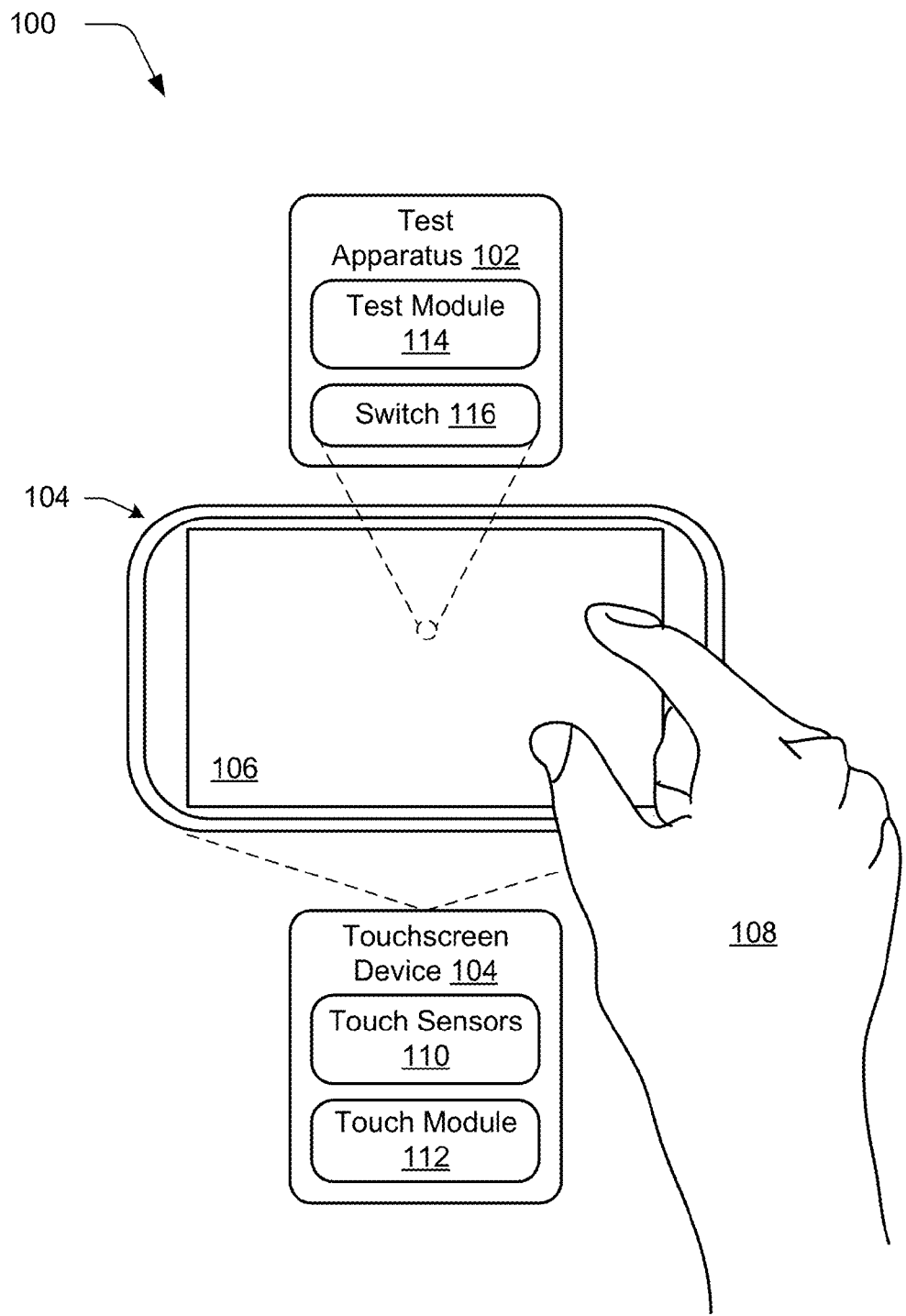
FIG. 1 is an illustration of an environment in an example implementation that is operable to utilize touchscreen testing techniques described herein.

FIG. 1 depicts an environment 100 in an example implementation that includes a test apparatus 102 that is suitable to test a touchscreen device 104. The touchscreen device 104 may be configured in a variety of ways. For example, the touchscreen device 104 may be configured as part of a mobile communication device such as a mobile phone, a portable game-playing device, a tablet computer, as part of a traditional computing device (e.g., a display device that is part of a laptop or personal computer), and so on.

Additionally, the touchscreen 106 of the touchscreen device 104 may be configured in a variety of ways. For example, the touchscreen 106 of the touchscreen device 104 may include sensors that are configured to detect contact with the touchscreen 106. Touch sensors 110 are typically used to report actual contact with the touchscreen 106, such as when being touched with a finger of a user's hand 108.

Examples of such touch sensors 110 include capacitive touch sensors. For instance, in projected capacitance an X-Y grid may be formed across the touchscreen using near optically transparent conductors (e.g., indium tin oxide) to detect contact at different X-Y locations on the touchscreen 106. Other capacitance techniques are also contemplated, such as surface capacitance, mutual capacitance, self-capacitance, and so on. Further, other touch sensors 110 are also contemplated in other instances, such as infrared, optical imaging, dispersive signal technology, acoustic pulse recognition, and so on.

Regardless of the type of touch sensors 110 used, inputs detected by the touch sensors 110 may then be processed by the touch module 112 to detect characteristics of the inputs, which may be used for a variety of purposes. For example, the touch module 112 may recognize that the touch input indicates selection of a particular object, may recognize one or more inputs as a gesture usable to initiate an operation of the touchscreen device 104 (e.g., expand a user interface), and so forth. However, this processing may rely upon the accuracy of the inputs and therefore conventional techniques that were utilized to test the touchscreen could result in an inaccurate touchscreen making it to market, which could hinder a user's interaction with the device.

In one or more implementations described herein, contact with a touchscreen 106 by a finger of a user's hand 108 is emulated by the test apparatus 102. For example, the test apparatus 102 may include a test module 114 and switch 116. which are configured to place a metal piece against the touchscreen 106. The switch 116, for instance, may be configured as a projected capacitance switch circuit that is used to alternate the conductor between grounded and ungrounded states. In this way, the switch 116 may effectively emulate a finger of a user's hand without moving the conductor. In other words, "up" and "down" touch events may mimic a press and removal of the user's finger without movement. These techniques may be utilized for a variety of different techniques, examples of which may be found in the corresponding sections.

Generally, any of the functions described herein can be implemented using software, firmware, hardware (e.g., fixed logic circuitry), or a combination of these implementations. The terms "module," "functionality," and "logic" as used herein generally represent software, firmware, hardware, or a combination thereof. In the case of a software implementation, the module, functionality, or logic represents program code that performs specified tasks when executed on a processor (e.g., CPU or CPUs). The program code can be stored in one or more computer readable memory devices. The features of the techniques described below are platform-independent, meaning that the techniques may be implemented on a variety of commercial computing platforms having a variety of processors.

For example, the test apparatus 102 and/or the touchscreen device 104 may be implemented using a computing device. The computing device may also include an entity (e.g., software) that causes hardware of the computing device to perform operations, e.g., processors, functional blocks, a "system-on-a-chip," and so on. For example, the computing device may include a computer-readable medium that may be configured to maintain instructions that cause the computing device, and more particularly hardware of the computing device to perform operations. Thus, the instructions function to configure the hardware to perform the operations and in this way result in transformation of the hardware to perform functions. The instructions may be provided by the computer-readable medium to the computing device through a variety of different configurations.

One such configuration of a computer-readable medium is signal bearing medium and thus is configured to transmit the instructions (e.g., as a carrier wave) to the hardware of the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may use magnetic, optical, and other techniques to store instructions and other data.

Adjustment of Grounding

Figure 2:
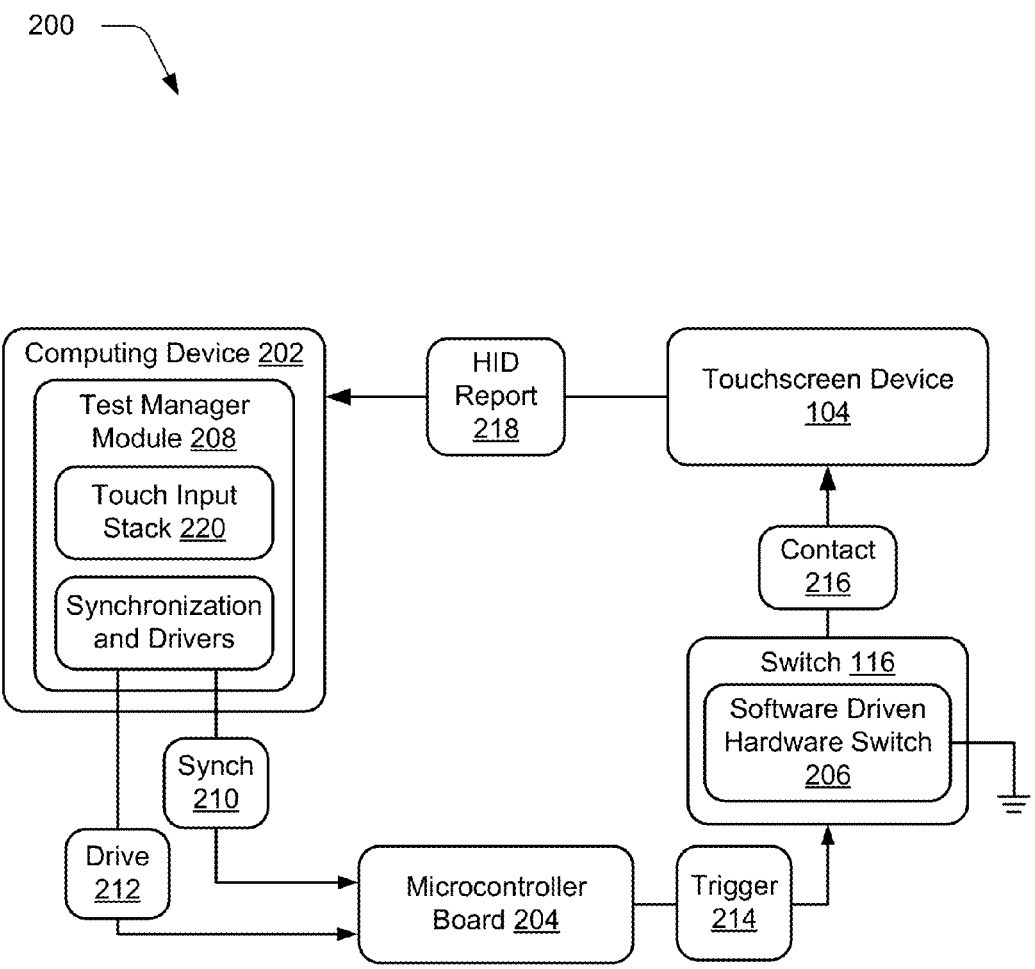
FIG. 2 is an illustration of a system in an example implementation showing a test apparatus of FIG. 1 as being implemented using a computing device.

FIG. 2 is an illustration of a system 200 in an example implementation showing the test apparatus 102 of FIG. 1 as being implemented using a computing device 202. Although illustrated separately, the computing device 202 includes a microcontroller board 204 (e.g., AT90USBKEY), the switch 116 configured as a software driven hardware switch 206 that is electrically coupled to a metal contact, and a touchscreen device 104 with is the device under test. In this example the touchscreen device 104 is configured as having a mutual or self-capacitance touch screen.

The computing device 202 is illustrated as including a test manager module 208 that is representative of functionality to manage the testing of the touchscreen device 104. The test manager module 208, for instance, may execute an application to synchronize 210 clocks on computing device 202 and the microcontroller board 204 and then drive 212 the microcontroller board 204.

Once a command is received by the microcontroller board 204 from the computing device 202, the microcontroller board 204 may trigger 214 the software driven hardware switch 206, such as to alternate between grounded and ungrounded (e.g., floating) states. Although a single switch is shown, it should be readily apparent that the system 200 may incorporate other numbers of switches, e.g., two, three, or even more, and the switch 116 may incorporate more than one grounded-metal contact. Thus, contact 216 of a grounded metal portion of the switch 116 with the touchscreen device 104 may be used to emulate both a touch and lack of a touch on the touchscreen device 104 under test by alternating between the states.

The touchscreen device 104 may then report contact through an HID report 218 to the computing device 202. For example, the HID report 218 may propagate through a touch input stack 220 to be reported to the test manager module 208, e.g., as WM_INPUT and WM_POINTER message in a WndProc function. The test manager module 208 may then process these messages and provide visual feedback, such as in a graphical user interface. Other examples of data that may be processed include HID over $I^2C$.

In an example system 200, the drive 212 signal may occur every two seconds although other time periods are also contemplated, such as non-periodical time intervals. This may result in a "contact down" event for two seconds, followed with a "contact up" event for the next two seconds by alternating between grounded and ungrounded states, respectively. LEDs disposed on the microcontroller board 204 may be used indicate both "up" and "down" events. Additionally, a rectangle in a top left corner of a display device of the computing device 202 may change color each time a WM_INPUT report is received.

As stated above, the test manager module 208 (e.g., through a hsync application) may be used to drive the microcontroller board 204 by sending "down" and "up" events at predefined intervals (e.g., two seconds) although other intervals are also contemplated. The test manager module 208 may also be used to listen for raw HID report 218 messages from the touchscreen device 104, e.g., WM_INPUT message. Upon receipt of each message, the test manager module 208 may render a rectangle (e.g., in a top left corner of a display device of the computing device 202), e.g., with a different color to provide feedback although other feedback mechanisms are also contemplated. A log file may also be generated by the test manager module 208 to describe the test performed. The microcontroller board 204 may also provide feedback, e.g., using two LEDs on the board in which one is for a "down" event and one is for an "up" event.

In an example situation when grounding is adjusted as described below, 2*f HID reports 218 may be expected for each two seconds of a DOWN event, in which "f" is a reporting rate for a touch sensor. For a touchscreen device 104 that reports at 105 Hz, for instance, two-hundred and ten messages may be expected to be received during the two seconds the switch 116 emulates "down" through a grounded state. Further, it is expected that few to no messages are received during the two seconds the switch 116 emulates an "up" event mimicked by an ungrounded state, e.g., expect for the first fifty to one hundred milliseconds right after the "up" even has been initiated due to latency. This information may be described in the log file generated by the test manager module 208.

The test manager module 208, for instance, may generate three log files. The first log file may summarize "down" event latency, the second log file may summarize "up" event latency, and the third log file may describe each of the logged information. An example of the log file is given in the following table:

```
freq = 2337920,
[ 1; 1; 4157019762]: 67233 us ± 1898 us 194
[ 3; 1; 4166371459]: 58207 us ± 1817 us 195
[ 5; 1; 4175723151]: 50159 us ± 1737 us 195
[ 7; 1; 4185074835]: 54075 us ± 1661 us 195
[ 9; 1; 4194426526]: 38007 us ± 1582 us 197
[ 11; 1; 4203778217]: 37887 us ± 1503 us 197
[ 13; 1; 4213129911]: 49844 us ± 1423 us 195
[ 15; 1; 4222481609]: 53665 us ± 1339 us 195
[ 17; 1; 4231833295]: 57747 us ± 1262 us 195
[ 19; 1; 4241184991]: 53546 us ± 1180 us 195
[ 21; 1; 4250536685]: 57453 us ± 1098 us 195
[ 23; 1; 4259888382]: 37387 us ± 2016 us 197
[ 25; 1; 4269240085]: 37267 us ± 1943 us 197
```

The first column in this example represents an index of the event, with each of the odd, the even events are in the "up" summary. The second column includes an identifier of the event, e.g., "1" equals "down" and "3" equals "up." The third column includes a real time timestamp. The fourth column describes actual measured "down"/"up" latency. The fifth column indicates an absolute (maximal) error in measurement, and finally the sixth column indicates number of messages received during the "down"/"up" event, e.g., during the two seconds of the event.

For reference, an excerpt from the second log file is presented below:

```
freq = 2337920,
[ 2; 3; 4161695608]: 65997 us ± 1861 us 7
[ 4; 3; 4171047311]: 57916 us ± 1776 us 6
[ 6; 3; 4180398993]: 61869 us ± 1703 us 7
[ 8; 3; 4189750682]: 65743 us ± 1633 us 7
[ 10; 3; 4199102374]: 65658 us ± 1551 us 7
[ 12; 3; 4208454063]: 57592 us ± 1479 us 6
[ 14; 3; 4217805764]: 61475 us ± 1387 us 7
[ 16; 3; 4227157451]: 65488 us ± 1311 us 7
[ 18; 3; 4236509143]: 57339 us ± 1231 us 6
[ 20; 3; 4245860840]: 61275 us ± 1154 us 7
[ 22; 3; 4255212531]: 65165 us ± 1068 us 7
[ 24; 3; 4264564234]: 65079 us ± 1977 us 7
[ 26; 3; 4273915933]: 57014 us ± 1901 us 6
```

The sixth column may be used to adjust grounding. The grounding condition may be adjusted in such way to obtain a repeatable number of packets for each measurement. In one or more implementations it is expected this number may vary, e.g., in the example above it varies from 194-197, which is about one to two percent of the time. For instance, a variation of up to ten percent may be considered permissible, and amounts above this value may be investigated. Once the setup and expected parameters are understood, the actual grounding adjustment may be performed.

Grounding Adjustment

In one or more implementations, a SNR (signal to noise ratio) is set at or near a highest possible value to select a proper grounding condition. One way to adjust grounding is to access the raw data, the procedure for adjusting ground in case this data is not available is also described below.

When raw data is available (e.g., from the HID report 218), the SNR may be calculated as follows. The amplitude of the touch (e.g., a change in an electrostatic field or changed perceived capacitance) as reported by the digitizers of the touchscreen device 104 is compared to the noise reported by the digitizer. An upper limit (i.e., the "highest possible value) to SNR may be established by simply pressing a finger against the digitizer and reading the reported amplitude. It may be normal to have lower SNR values for emulated touch, even as low as half of the upper limit.

Figure 3:
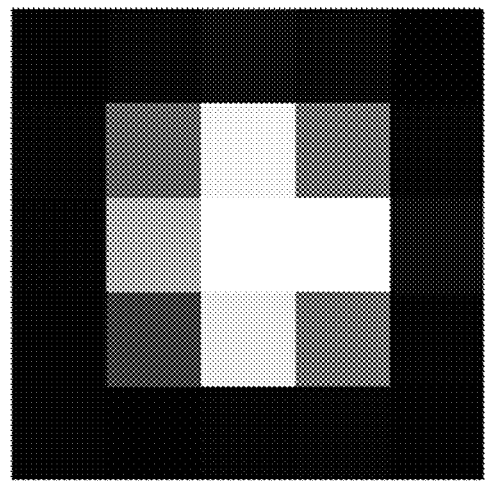
FIG. 3 is an illustration of a representation of a matrix of touch amplitudes

First, the proper environmental conditions are selected. It may be noted particular conditions may not be involved, but that results could depend on the conditions. Next, a readout is made in case a human finger is pressed against the digitizer, a matrix of amplitudes, which may be similar to the table below and the image as shown in the example implementation of FIG. 3. Particular care may be made to a maximum value of the amplitude, which in this case would be 255. Reading out the noise may not be performed as long the noise levels are not changed in the presence of the switch, which may not happen in this case. The following table is an example of raw touch data, illustration of which is shown in the example implementation 300 of FIG. 3.

| 10 | 20  | 30  | 22  | 6  |
|----|-----|-----|-----|----|
| 16 | 106 | 246 | 118 | 16 |
| 14 | 182 | 255 | 255 | 30 |
| 10 | 64  | 236 | 120 | 14 |
| 10 | 6   | 12  | 16  | 8  |

In a next step, a metal contact that is electrically coupled to the switch 116 is introduced to a touch digitizer of the touchscreen device 104. This may effectively change a baseline of the digitizer, which may involve a certain period for recalibrating. For example, a touch digitizer may perform this automatically in a process referred to as rebaselining and may take from a fraction of a second up to two minutes. This process may be tracked by observing the raw data, e.g., the HID report 218. Once noise levels in the area of the switch 116 become similar or the same as in the remainder of the digitizer, the next step is performed.

In some implementations, rebaselining may not be a trivial task for a digitizer and it could happen that digitizer does not reach average noise levels. If this is the case, the grounding may be adjusted. This may be done in several interactions, starting from a relatively small amount grounding (e.g., no grounding) and gradually increasing the amount until finally a large metal piece that is not connected to the power grid ground is attached, e.g., a metal table, unplugged computer box and similar, use of a human body as a ground, and so on. Usually a lack of grounding may enable the re-baselining. The minimum and maximum amount of metal used to allow re-baselining may be observed and recorded. As a result of this procedure, ghost touches (e.g., false positive indications of touch) do not occur while switch is in passive state in most instances.

The switch 116 may then be set to active state to emulate touch, e.g., by placing the conductor in a grounded state. This procedure may be similar to the previous procedure, but this time the highest amplitude of the touch compared to the previously established upper bound is determined.

An optimal amount of grounding material may be selected given the four mentioned values, e.g., in the middle of their intersection. For example, passive minimum and maximum may be lower than active minimum and maximum, thereby yielding the following intersection: [active minimum, passive maximum].

After this process is concluded the following setup may be achieved. First, while in a passive state there are no ghost touches whereas while active there are no false negative touches that involve failure to report a touch, i.e., a full frame rate is reported. Additionally, the affected baseline may have the same noise distribution as the rest of the digitizer and the maximum amplitude may be the best possible (e.g., best SNR)

In case raw data is not accessible a slightly indirect technique may be used in which reported touch events instead of the raw data from the HID report 218. In this case, the procedure starts with no grounding material and a test is performed of both passive and actives states. The amount of grounding is then gradually increased such that in a passive state there are no ghost touches and in the active state there are no missed touch reports, e.g., at a maximum frame rate. Minimum and maximum amounts of grounding are obtained such that two conditions above are met. Finally, an approximate middle of this range is selected as the optimal or near optimal grounding condition.

Figure 4:
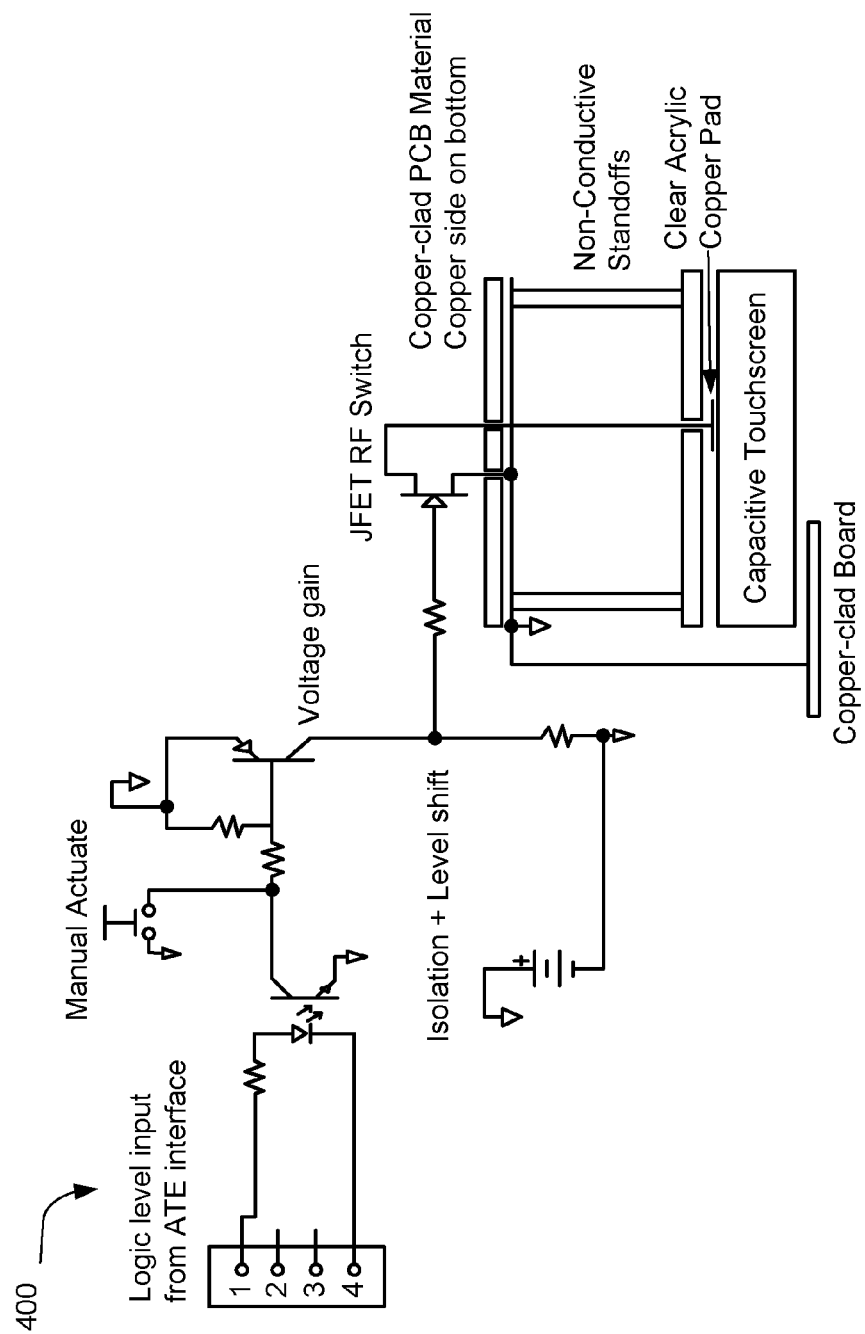
FIG. 4 depicts an implementation example of the system of FIG. 2.

FIG. 4 depicts an implementation example 400 of the system 200 of FIG. 2. In this example implementation 400, a RF JFET can be used as a high speed switching circuit. It should be noted that this implementation may be optimized for emulating a particular touch screen device. For example, the proposed grounding of the copper-clad board (e.g., 1.8"×3.9") may be modified for implementation on different touchscreen devices as described above.

Example Procedures

The following discussion describes touchscreen testing techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to the environment 100 of FIG. 1 and the systems 200, 400 of FIGS. 2 and 4.

Figure 5:
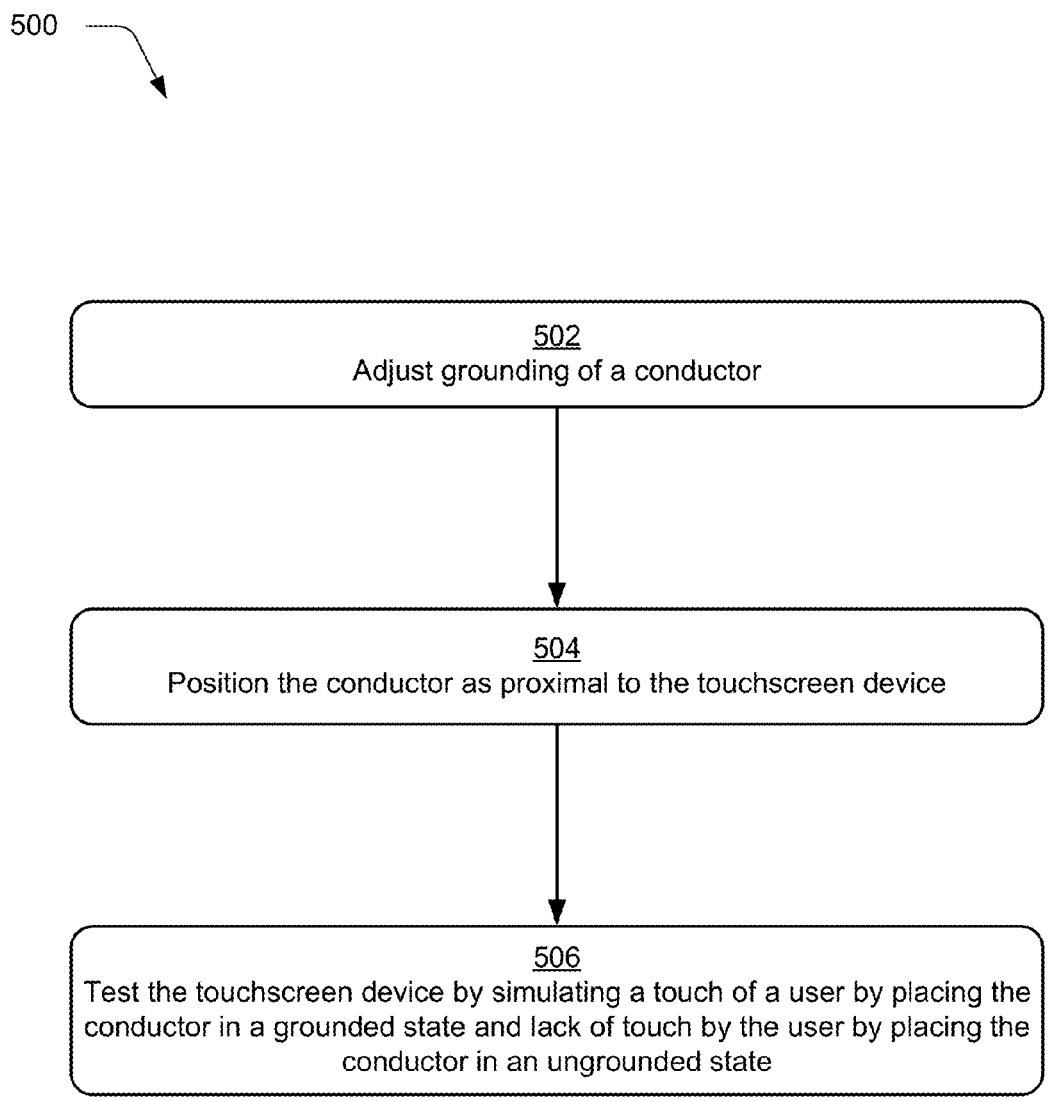
FIG. 5 is a flow diagram depicting a procedure in an example implementation in which grounding is adjusted and a touchscreen device is tested.

FIG. 5 is a flow diagram depicting a procedure 500 in an example implementation in which grounding is adjusted and a touchscreen device is tested. Grounding of a conductor is adjusted (block 502). For example, this technique may involve data received from digitizers of the touchscreen device 104, such as the HID report. This technique may also be performed without this data as previously described above.

The conductor is positioned proximal to the touchscreen device (block 504). For example, the conductor may be placed within range of capacitance sensors of the touchscreen device 104, which may include contact or near contact by the conductor against digitizers of the touchscreen device 104.

The touchscreen device is tested by simulating a touch of a user by placing the conductor in a grounded state and lack of touch by the user by placing the conductor in an ungrounded state (block 506). A switch 116, for instance, may be used to alternate between the grounded and ungrounded stated. Thus, the conductor may remain unmoving yet still used to test both touch and a lack of touch. A variety of other examples are also contemplated as previously described.

Example Device

Figure 6:
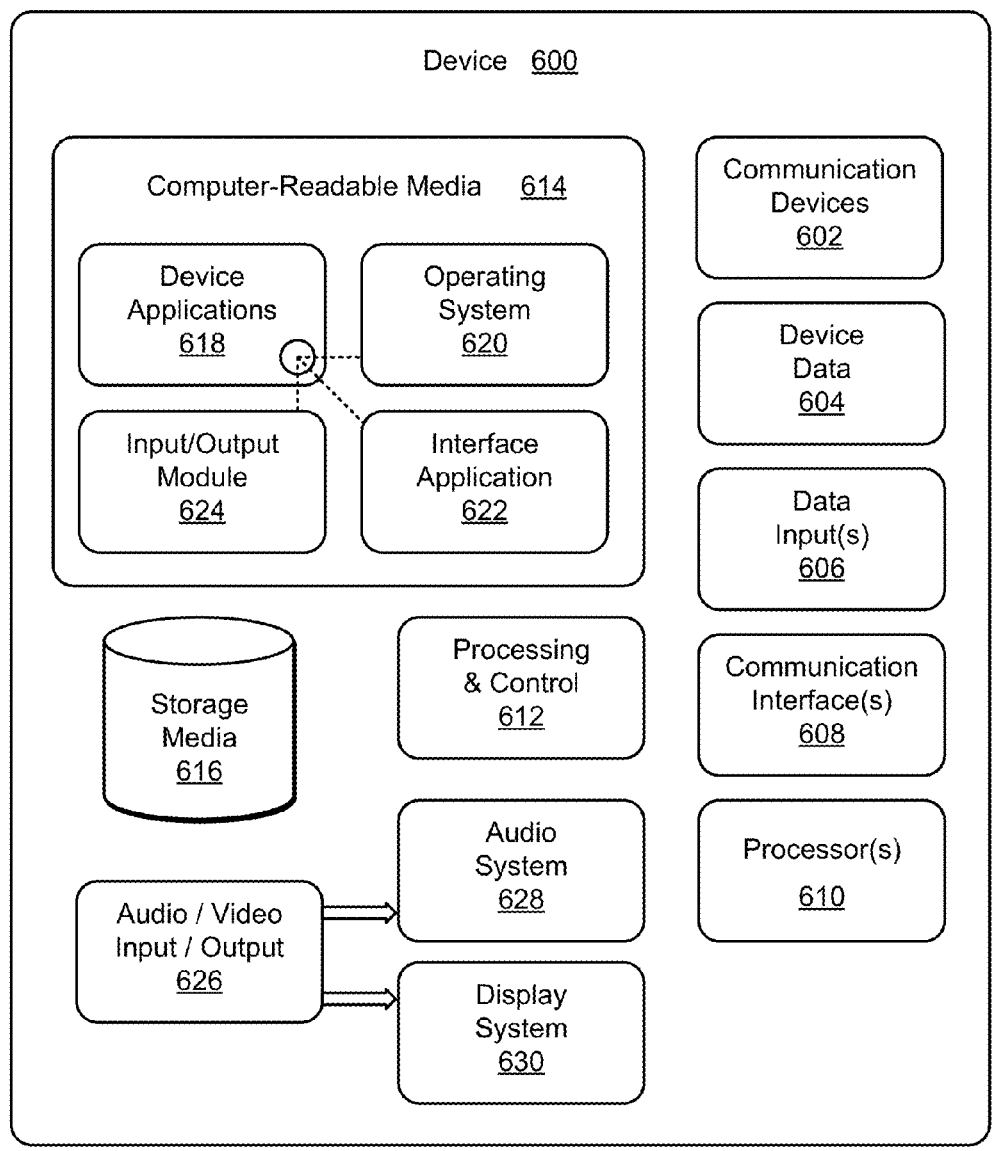
FIG. 6 illustrates various components of an example device that can be implemented as any type of computing device as described with reference to FIGS. 1 and 2 to implement embodiments of the techniques described herein.

FIG. 6 illustrates various components of an example device 600 that can be implemented as any type of computing device as described with reference to FIGS. 1 and 2 to implement embodiments of the techniques described herein, both to perform the testing as well as to be tested. Device 600 includes communication devices 602 that enable wired and/or wireless communication of device data 604 (e.g., received data, data that is being received, data scheduled for broadcast, data packets of the data, etc.). The device data 604 or other device content can include configuration settings of the device, media content stored on the device, and/or information associated with a user of the device. Media content stored on device 600 can include any type of audio, video, and/or image data. Device 600 includes one or more data inputs 606 via which any type of data, media content, and/or inputs can be received, such as user-selectable inputs, messages, music, television media content, recorded video content, and any other type of audio, video, and/or image data received from any content and/or data source.

Device 600 also includes communication interfaces 608 that can be implemented as any one or more of a serial and/or parallel interface, a wireless interface, any type of network interface, a modem, and as any other type of communication interface. The communication interfaces 608 provide a connection and/or communication links between device 600 and a communication network by which other electronic, computing, and communication devices communicate data with device 600.

Device 600 includes one or more processors 610 (e.g., any of microprocessors, controllers, and the like) which process various computer-executable instructions to control the operation of device 600 and to implement embodiments of the techniques described herein. Alternatively or in addition, device 600 can be implemented with any one or combination of hardware, firmware, or fixed logic circuitry that is implemented in connection with processing and control circuits which are generally identified at 612. Although not shown, device 600 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Device 600 also includes computer-readable media 614, such as one or more memory components, examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Device 600 can also include a mass storage media device 616.

Computer-readable media 614 provides data storage mechanisms to store the device data 604, as well as various device applications 618 and any other types of information and/or data related to operational aspects of device 600. For example, an operating system 620 can be maintained as a computer application with the computer-readable media 614 and executed on processors 610. The device applications 618 can include a device manager (e.g., a control application, software application, signal processing and control module, code that is native to a particular device, a hardware abstraction layer for a particular device, etc.). The device applications 618 also include any system components or modules to implement embodiments of the gesture techniques described herein. In this example, the device applications 618 include an interface application 622 and an input/output module 624 (which may be the same or different as input/output module 114) that are shown as software modules and/or computer applications. The input/output module 624 is representative of software that is used to provide an interface with a device configured to capture inputs, such as a touchscreen, track pad, camera, microphone, and so on. Alternatively or in addition, the interface application 622 and the input/output module 624 can be implemented as hardware, software, firmware, or any combination thereof. Additionally, the input/output module 624 may be configured to support multiple input devices, such as separate devices to capture visual and audio inputs, respectively.

Device 600 also includes an audio and/or video input-output system 626 that provides audio data to an audio system 628 and/or provides video data to a display system 630, e.g., a touchscreen device. The audio system 628 and/or the display system 630 can include any devices that process, display, and/or otherwise render audio, video, and image data. Video signals and audio signals can be communicated from device 600 to an audio device and/or to a display device via an RF (radio frequency) link, S-video link, composite video link, component video link, DVI (digital video interface), analog audio connection, or other similar communication link. In an embodiment, the audio system 628 and/or the display system 630 are implemented as external components to device 600. Alternatively, the audio system 628 and/or the display system 630 are implemented as integrated components of example device 600.

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A method comprising:
    causing an electrical switch to place a conductor positioned proximal to a touchscreen device in a grounded state by a computing device when positioned proximal to the touchscreen device to emulate a touch by a user; and
    causing the electrical switch to place the conductor in an ungrounded state when positioned proximal to the touchscreen device by a computing device to emulate lack of a touch by the user.

2. A method as described in claim 1, wherein an amount of grounding in the grounding state applied by the conductor is adjusted to reduce ghost touches and missed touch reports.

3. A method as described in claim 1, further comprising: testing by collecting data from digitizers of the touchscreen device.

4. A method as described in claim 3, wherein the data references amplitudes of touches.

5. An apparatus comprising:
    a conductor configured to contact a touchscreen device;
    an electrical switch that is electrically coupled to the conductor; and
    one or more modules communicatively coupled to the electrical switch, the one or more modules configured to test the touchscreen device by simulating a touch of a user using the electrical switch by placing the conductor in a grounded state and lack of touch by the user by placing the conductor in an ungrounded state.

6. An apparatus as described in claim 5, wherein the placing of the conductor in the ungrounded state is performed while the conductor is in contact with the touchscreen device yet simulates the lack of the touch by the user.

7. An apparatus as described in claim 5, wherein the testing further comprises collecting data from the touchscreen device.

8. An apparatus as described in claim 5, further comprising adjusting grounding of the conductor.

9. An apparatus as described in claim 8, wherein the adjusting is performed to reduce ghost touches and missed touch reports.

10. An apparatus as described in claim 9, wherein the adjusting is based on establishing a passive minimum and maximum and establishing an active minimum and maximum of values described in data received from digitizers of the touchscreen device and using the established passive minimum and maximum and established active minimum and maximum to select a grounding condition.

11. An apparatus as described in claim 9, wherein the adjusting is performed by varying an amount of grounding material.

12. An apparatus as described in claim 11, wherein the adjusting performed by varying the amount of grounding material is performed without receiving data from digitizers of the touchscreen device that reference amplitudes of touches.

13. An apparatus comprising:
    a conductor configured to contact a touchscreen device; and
    one or more modules communicatively configured to test the touchscreen device by simulating a touch of a user by placing the conductor in a grounded state and lack of touch by the user by placing the conductor in an ungrounded state.

14. An apparatus as described in claim 13, wherein the placing of the conductor in the ungrounded state is performed while the conductor is in contact with the touchscreen device yet simulates the lack of the touch by the user.

15. An apparatus as described in claim 13, wherein the testing further comprises collecting data from the touchscreen device.

16. An apparatus as described in claim 13, further comprising adjusting grounding of the conductor.

17. An apparatus as described in claim 16, wherein the adjusting is performed to reduce ghost touches and missed touch reports.

18. An apparatus as described in claim 17, wherein the adjusting is based on establishing a passive minimum and maximum and establishing an active minimum and maximum of values described in data received from digitizers of the touchscreen device and using the established passive minimum and maximum and established active minimum and maximum to select a grounding condition.

19. An apparatus as described in claim 17, wherein the adjusting is performed by varying an amount of grounding material.

20. An apparatus as described in claim 19 wherein the adjusting performed by varying the amount of grounding material is performed without receiving data from digitizers of the touchscreen device that reference amplitudes of touches.

* * * * *